(12) United States Patent
Lin et al.

(10) Patent No.: US 7,392,494 B2
(45) Date of Patent: Jun. 24, 2008

(54) CLUSTERING CIRCUIT PATHS IN ELECTRONIC CIRCUIT DESIGN

(76) Inventors: Kuoching Lin, 22419 Janice Ave., Cupertino, CA (US) 92024; Lungtien Liu, 3438 Lorimer La., Encinitas, CA (US) 92024

( * ) Notice: Subject to any disclaimer, the term of this patent is extended or adjusted under 35 U.S.C. 154(b) by 488 days.

(21) Appl. No.: 10/458,067

(22) Filed: Jun. 9, 2003

(65) Prior Publication Data
US 2004/0250226 A1 Dec. 9, 2004

(51) Int. Cl.
*G06F 17/50* (2006.01)
(52) U.S. Cl. ............................................. 716/7; 716/6
(58) Field of Classification Search ................. 716/4–7, 716/2, 18
See application file for complete search history.

(56) References Cited

U.S. PATENT DOCUMENTS

| | | | | |
|---|---|---|---|---|
| 6,086,628 A | * | 7/2000 | Dave et al. | 716/7 |
| 6,112,023 A | * | 8/2000 | Dave et al. | 703/27 |
| 6,209,119 B1 | * | 3/2001 | Fukui | 716/2 |
| 6,230,303 B1 | * | 5/2001 | Dave | 716/7 |
| 6,286,128 B1 | * | 9/2001 | Pileggi et al. | 716/18 |
| 6,487,697 B1 | * | 11/2002 | Lu et al. | 716/2 |
| 6,557,145 B2 | * | 4/2003 | Boyle et al. | 716/2 |
| 6,763,506 B1 | * | 7/2004 | Betz et al. | 716/6 |
| 6,912,702 B1 | * | 6/2005 | Iyer et al. | 716/6 |
| 7,000,211 B2 | * | 2/2006 | Arnold | 716/17 |
| 7,203,919 B2 | | 4/2007 | Suaris et al. | |
| 7,203,929 B1 | | 4/2007 | Vinodkrishnan et al. | |
| 2002/0023252 A1 | | 2/2002 | Lee et al. | |

* cited by examiner

*Primary Examiner*—Jack Chiang
*Assistant Examiner*—Binh Tat
(74) *Attorney, Agent, or Firm*—Klarquist Sparkman, LLP

(57) ABSTRACT

Techniques are disclosed for clustering circuit paths in an electronic design automation process for use in improving the timing characteristics of the overall circuit design. Circuit paths included in the cluster may be subjected to placing and routing as a group to relocate instances of circuit components included in the clustered circuit paths to thereby improve the overall circuit design timing.

32 Claims, 8 Drawing Sheets

CLUSTERING CIRCUIT PATHS IN ELECTRONIC CIRCUIT DESIGN

TECHNICAL FIELD

The technical field relates to electronic design automation (EDA). More particularly, the field relates to methods and apparatus for clustering circuit paths to facilitate the electronic circuit design.

BACKGROUND

With the advent of EDA, design of complex hardware systems no longer begins with a hardware circuit diagram. Instead, circuit design typically begins with a software program that describes the behaviour or functionality of the hardware system. In one exemplary approach, the behaviour or functionality of an electronic circuit design may be described using hardware description language (HDL) (e.g., VHDL and Verilog). Circuit designers may use logical and physical synthesis tools to generate a net list which includes a list of components or instances included in the circuit and interconnections between the various components. At the synthesis level, designers may generate alternative architectures for an electronic circuit being designed by modifying constraints (such as clock, number and type of data path elements, and desired number of clock cycles). The net list and information about the layout of the circuit may be used to determine the optimal placement of the various components of the circuit and their routing. The physical circuit embodying the design may then be created in the design process.

As part of the electronic design automation process, the timing characteristics of the circuit design are evaluated. This may be done before detailed placement and routing of the circuit instances during the logical synthesis portion of the circuit design. Timing analysis may alternatively be performed following placement and routing during physical placement of instances during the electronic design automation process. Although the dynamic timing characteristics may be evaluated, often the static timing characteristics of the circuit is determined during this timing analysis. For example, for a given circuit clock speed, a circuit path require time may be determined. The require time is the time allowed for a signal to propagate through a particular circuit path and which meets the circuit timing requirements. The path delay time of the designed version of the electronic circuit is determined and compared with the require time to evaluate whether the signal delay time along the path (path delay) meets the require time for that path. It is common for a path slack to be determined for the various circuit paths in the circuit with the path slack being the difference between the require time and path delay. In this approach, a zero or positive path slack indicates the path complies with timing requirements. In contrast, a negative path slack indicates that the circuit path fails to meet the timing requirements at the clock speed at which it is desired to operate the circuit. By altering the positioning of circuit components or instances relative to one another, in many cases it is possible to alter the path delay and thereby the slack for a given circuit path. Desirably, the path delay is adjusted until all of the circuit paths meet or exceed the require time.

To assist in the timing evaluation process, pin slacks for the various pins of the circuit components included in the various circuit paths may be determined. In one common approach, pin slack is defined as the worst path slack of all circuit paths connected to the particular pin or which passes through the particular pin.

In a known approach for replacing circuit components or instances to improve timing characteristics of an electronic circuit design in an EDA process, the individual circuit path having the worst slack is selected. The placement of instances along this selected individual circuit path relative to one another is adjusted, typically to reduce the length of circuit interconnects between the instances. The goal of this approach is to improve the timing characteristics (slack) for this particular circuit path. The next worst case path may then be selected, circuit instances along the path may be relocated relative to one another, and timing again rechecked. In an ideal situation, this individual path by path iterative process eventually results in an electronic circuit design that meets the require time for all circuit paths at a designated circuit speed. Alternatively, the clock speed may be slowed to increase the require time as a way of reaching closure of the circuit design, that is a design in which all of the circuit paths meet the require time. The adjustment of the positioning of circuit instances along an individual path relative to one another can result in a degradation of the timing characteristics of other circuit paths, such as other paths connected to the selected path. As a result, placement of instances to achieve the required timing for the various circuit paths can be more time consuming and difficult to achieve.

Therefore, a need exists for improvements in electronic design automation to facilitate the achievement of an electronic circuit design which meets required timing characteristics for the circuit.

SUMMARY

In this description, a sequential element or sequential instance is a circuit component in which a clock pulse causes the transfer of signals at one or more input pins of the element in the element, such as to one or more output pins of the element. Thus, a sequential element is a clocked element and may, for example, be clocked with the leading edge of a clock pulse. Sequential elements include, but are not limited to shift registers, flip-flops and other clocked circuit components. A combinational element or instance refers to a circuit component which does not require a clock signal for the transfer of inputs to outputs. Lookup tables (LUTs) and gates (Gs), as well as other non-clocked components, are examples of combinational elements. In addition, interconnects refer to the circuit paths or traces (and portions thereof) which connect pins of instances together in a circuit path. In this description, the term primary port refers to a primary input port or a primary output port through which external connections are to be made to the designed circuit. Typically specific areas around the perimeter of a chip are designated locations for primary ports.

A circuit path comprises, in one example, at least one interconnect and typically includes one or more combinational elements. In general, in complex electronic circuit designs, a circuit path typically includes multiple combinational elements together with interconnects as required to couple the desired pins of the combinational elements together to form a circuit path from a beginning location to an end location. In the description which follows, a circuit path is desirably defined as commencing from a primary port or a sequential element and ending at a primary port or sequential element. The circuit path most desirably includes the port or sequential element at the starting location of the circuit path and the primary port or sequential element at the end of the circuit path. Thus, in a desirable approach, the originating and terminating sequential element or primary port for the circuit path is included in the circuit path. This approach typically provides the most flexibility in modifications to the placement of components during a placing and routing operation as the starting and terminating elements of circuit paths may be relocated along with combinational elements and interconnects which are in-between these starting and terminal elements. Primary ports are typically confined to locations along specific portions of a chip design and a particular primary port may be fixed at a particular location in a given circuit design. Less desirably, the circuit path may be defined to include only one of either the starting or terminating sequential element or primary port. As an even less desirable option, the circuit path may be defined as beginning at the output pin of a sequential element at the start of the circuit path (or the primary port at such location) and ending at an input pin of a sequential element (or primary port) at the end of the circuit path. Either of these latter two approaches allows less flexibility in adjusting the placement and routing of components of a circuit path because the exclusion of one or both starting and terminal elements from the circuit path can limit the relocation of such excluded elements during placing and routing of components in the circuit path.

In one aspect of an embodiment of a method, a plurality of circuit paths of an electronic circuit design are clustered. The determination of which paths to include in the cluster is of importance to this embodiment. For example, a first circuit path may be included in the cluster which has a slack which does not meet a slack threshold. This slack threshold may correspond to the path slack or to the pin slack, and more desirably corresponds to the pin slack. The threshold may be set as zero slack or at a positive number to provide greater tolerance in the circuit design, such as at one. In accordance with this embodiment, at least one additional circuit path is included in the cluster which does not meet the slack threshold and which is connected to the first circuit path included in the cluster without passing through any of a sequential element, a primary input port or a primary output port. Thus, the cluster in this embodiment is comprised of the first circuit path and the at least one additional circuit path which is connected in this manner. This additional circuit path may be deemed a proximate circuit path in that it can be traced from a combinational element or interconnect of the first selected circuit path without passing through a sequential element or a primary port. A placing and routing procedure is desirably performed on the cluster of circuit paths and results in the adjustment of the placement of circuit components or instances included in the cluster of circuit paths. For example, this procedure typically reduces the length of at least some of the circuit interconnections included in the clustered circuit paths to thereby improve the timing characteristics of the cluster and thereby of the circuit design. The clustering of circuit paths for further processing reduces the likelihood of the adjustment of instances in one circuit path degrading the timing characteristics of a proximate circuit path. As a result, closure on a desirable physical circuit layout is more likely to occur for a given clock speed and such closure can typically be achieved in a shorter time period.

In accordance with an aspect of another embodiment, the cluster of circuit paths may include all circuit paths which do not meet the slack threshold and which are connected to the first circuit path without passing through any of a sequential element or primary port. Again, the cluster may be subjected to a placing and routing procedure by which the placement of circuit components or instances included in the cluster is adjusted to reduce the length of at least a plurality of the circuit interconnections. Following the placement and routing operation, the timing may be rechecked and the process continued with a different cluster (or further processing of the same cluster) of circuit paths.

In accordance with another aspect of an embodiment, desirably all circuit paths which meet the slack threshold and which are connected to the first circuit path without passing through any of the sequential element or primary port are excluded from the cluster. Since these excluded circuit paths meet the timing criteria for the circuit design, processing of the cluster of paths with these paths being excluded is an efficient approach and the probabilities of these excluded paths being degraded by the placement and routing operations on the included paths is at an acceptable level.

It is possible to expand the cluster beyond a particular sequential element by, for example, including at least one separated circuit path in the cluster. The separated circuit path is one which is not connected to the first circuit path without passing through at least one of a sequential element or a primary port. Thus, for example, a separated circuit path may be on the opposite side of a sequential element from circuit paths included in the original cluster. The circuit designer may be provided with a user actuated option of picking up one or more such separated circuit paths in the cluster. Typically, a separated circuit path is not included in a cluster if the separated circuit path meets the slack threshold. In the event a separated circuit path is included in the cluster, in a desirable embodiment, other proximate separated circuit paths (which are connected to the selected separated circuit path and which do not pass through a primary port or sequential element) and which also fail to meet the slack threshold, may be included in the cluster. In other words, the clustering may continue beyond a sequential element. In addition, the cluster may include additional separated circuit paths which are separated from the initial separated circuit path included in the cluster, particularly if such further separated circuit paths do not meet the slack threshold. The extent to which such further separated circuit paths may be included in a cluster may be limited.

As another aspect of an embodiment of a method, at least one group of plural circuit paths may be identified. A subset of circuit paths from the identified at least one group of plural circuit paths may be clustered together with such subset of clustered circuit paths comprising circuit paths which are proximate to one another and which do not meet a timing threshold for the electronic circuit design. The placement of circuit components in the clustered subset of circuit paths may be adjusted to modify the electronic circuit design of at least the clustered subset of circuit paths. The clustered subset may be limited to only include proximate circuit paths from the at least one group of plural circuit paths which do not meet the timing threshold for the electronic circuit design.

As yet another aspect of a method, a first circuit path of an electronic circuit design may be selected which comprises at least one of a first combinational element or first interconnect and which fails to meet timing criteria for the electronic circuit design. The timing criteria is desirably set prior to selecting the first circuit path. In addition, the timing criteria may be adjusted and may comprise adjusting a previously set timing criteria. One or more, and more desirably all, other circuit paths which fail to meet the timing criteria and which can be traced to a first combinational element or first interconnect of the first circuit path without passing through any of a primary port or sequential element may also be selected. The timing characteristics of at least the selected first and selected other circuit paths may be evaluated or rechecked following adjustment of the positioning of instances of circuit components along the selected first and selected other circuit paths. The first circuit path may be selected from a portion of an electronic circuit design and may be a circuit path in such selected portion of the electronic circuit design which is farthest from meeting the timing criteria. Circuit paths which meet the timing criteria and which can be traced to the first combinational element or first interconnect without passing through any of the sequential element or primary port may be excluded from the selected first and selected other circuit paths. In addition, one or more separated circuit paths may also be selected and included in a cluster of circuit paths which is subjected to timing analysis, placing and routing, and timing rechecking. Desirably, a separated circuit path is not selected unless it fails to meet the timing criteria.

Other separated circuit paths which fail to meet the timing criteria and which can be traced to a combinational element or interconnect of the selected at least one separated circuit path without passing through any of a sequential element or primary port may also be included in a cluster which is processed.

In determining the circuit paths which are included in a cluster, one may trace a selected circuit path in a first direction from, for example, at least one combinational element or interconnect. A subset of circuit paths may be included in a cluster with the one selected circuit path. Desirably, the subset of circuit paths is comprised of circuit paths which can be traced by such tracing in the first direction without crossing any of a sequential element or primary port. Following the tracing in the first direction, the at least one circuit path may then be traced in a second direction opposite to the first direction from said at least one combinational element or interconnect. Desirably, the subset also is comprised of circuit paths which fail to meet the timing criteria and which can be reached by such tracing in the second direction without crossing any of the sequential element or a primary port. This particular embodiment thus contemplates backward and forward tracing in order to determine the cluster of circuit paths. It should be noted that tracing can be accomplished in alternative ways, such as starting at a primary port or sequential element and proceeding in only one direction. Again, additional circuit paths, such as separated circuit paths, may be included in the cluster. Those circuit paths which meet timing criteria may be excluded from the cluster even though they may be traced from one combinational element or interconnect of a first circuit without crossing any of the sequential element or a primary output port.

In accordance with another aspect, the circuit paths included in the cluster desirably each have at least one path element such as comprising an interconnect or a combinational component.

A computer program for implementing the above described embodiments may be stored on computer readable media in accordance with an aspect of an embodiment. A computer system comprising a processor, memory and an input device, such as a keyboard, mouse or other data entry mechanism, may be programmed to carryout the embodiments of the method in accordance with another aspect. In addition, the methods may be implemented in a client/server network arrangement with portions of the electronic circuit design, such as the clustering aspects, being carried out, for example, on a server. The resulting electronic files may be transferred from the server to client computers via a network or less desirably by physically transporting computer-readable media.

DETAILED DESCRIPTION

Figure 1:
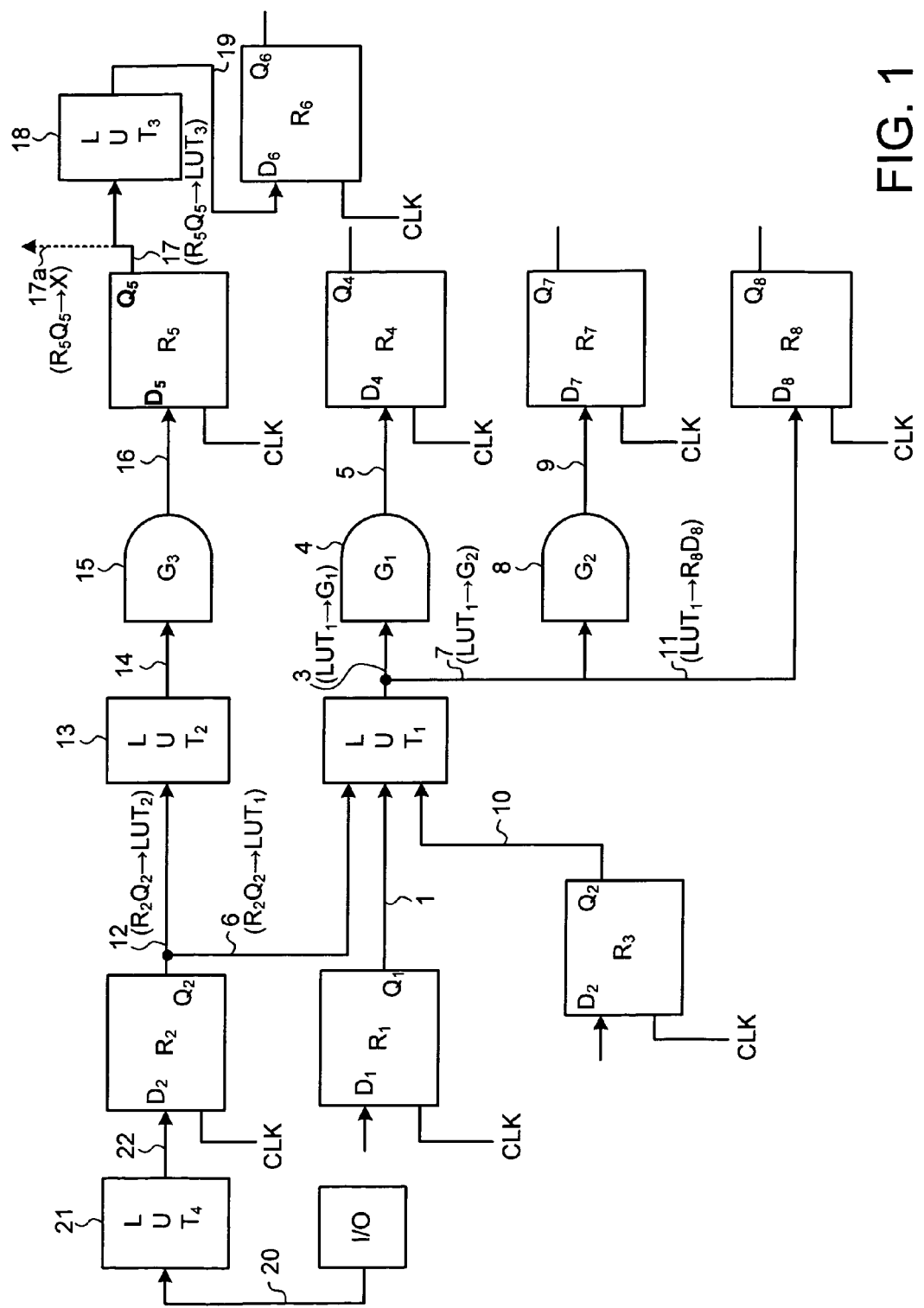
FIG. 1 is a schematic diagram of a simplified version of a portion of an exemplary electronic circuit design for use in illustrating the various embodiments.

With reference to FIG. 1, a portion of an electronic circuit design is shown for purposes of illustrating the concepts described herein. This circuit design includes a plurality of circuit paths extending from a primary port or a sequential element to another primary port or sequential element without any intervening primary ports or sequential elements. As previously mentioned, the circuit paths may be defined as including the primary port or sequential element at one or both ends of the circuit path.

Thus, for example, in FIG. 1 a first circuit path or path 1 may be defined as starting at $R_1$, a sequential element, which in this example is the form of a shift register or DQ flipflop having input $D_1$, output $Q_1$ and a clock input CLK. For purposes of discussion, the respective D and Q inputs of these exemplary sequential elements are subscripted with a number corresponding to the number of the sequential element. Thus, the D input and Q output of $R_1$ are subscripted respectively as $D_1$ and $Q_1$. This numbering convention is used throughout this description for convenience only. From $R_1$, path 1 passes along path segment 1 to a combinational element which, in this case, is a lookup table (LUT 1). LUT 1 is designated path segment 2 in FIG. 1. From LUT 1, this circuit path 1 follows path segment 3 in the form of an interconnect extending from LUT 1 to a gate, $G_1$. Gate $G_1$ is path segment 4 of this particular path. From $G_1$ the path 1 follows a path segment 5 in the form of an interconnect to the D input ($D_4$) of a shift register $R_4$ having an output $Q_4$. Thus, path 1 is $R_1$ to LUT1 to $G_1$ to $R_4$.

As another example, path 2 is from $R_1$ to LUT1 to $G_2$ to $R_7$ and thus includes path segments 1, 2, 7, 8 and 9 in FIG. 1.

Table 1 below sets forth the various paths depicted in the portion of the electronic circuit design shown in FIG. 1 and also designates their associated path segments. In Table 1, path 13 is from $R_5$ to a primary port or sequential element X with 17a designating the collection of circuit components and interconnects from output pin $Q_5$ of register $R_5$ to the element X.

TABLE 1

| PATH NUMBER | COMPONENT PATH | PATH SEGMENTS |
|---|---|---|
| PATH 1 | $R_1 \rightarrow LUT_1 \rightarrow G_1 \rightarrow R_4$ | 1, 2, 3, 4, 5 |
| PATH 2 | $R_1 \rightarrow LUT_1 \rightarrow G_2 \rightarrow R_7$ | 1, 2, 7, 8, 9 |
| PATH 3 | $R_1 \rightarrow LUT_1 \rightarrow R_8$ | 1, 2, 11 |
| PATH 4 | $R_2 \rightarrow LUT_1 \rightarrow G_1 \rightarrow R_4$ | 6, 2, 3, 4, 5 |
| PATH 5 | $R_2 \rightarrow LUT_1 \rightarrow G_2 \rightarrow R_7$ | 6, 2, 7, 8, 9 |
| PATH 6 | $R_2 \rightarrow LUT_1 \rightarrow R_8$ | 6, 2, 11 |
| PATH 7 | $R_3 \rightarrow LUT_1 \rightarrow G_1 \rightarrow R_4$ | 10, 2, 3, 4, 5 |
| PATH 8 | $R_3 \rightarrow LUT_1 \rightarrow G_2 \rightarrow R_7$ | 10, 2, 7, 8, 9 |
| PATH 9 | $R_3 \rightarrow LUT_1 \rightarrow R_8$ | 10, 2, 11 |
| PATH 10 | $R_2 \rightarrow LUT_2 \rightarrow G_3 \rightarrow R_5$ | 12, 13, 14, 15, 16 |
| PATH 11 | $R_5 \rightarrow LUT_3 \rightarrow R_6$ | 17, 18, 19 |
| PATH 12 | $I/O \rightarrow LUT_4 \rightarrow R_2$ | 20, 21, 22 |
| PATH 13 | $R_5$--(via path segment(s) 17a) $\rightarrow$ X | 17a, . . . X |

During electronic design automation, following initial placing and routing and timing analysis, for example static timing analysis, a graphical display of the circuit design may be provided. Certain portions of the circuit design may be highlighted or otherwise distinguished in this display by color or in some other manner to indicate circuit timing problems. This facilitates the selection of a portion of the circuit design for modification to improve the timing characteristics of this portion of the circuit design and thereby of the overall circuit design.

During the performance of static timing analysis, the circuit delays of the various circuit path segments may be determined along with the path delay associated with a particular circuit path.

Table 2 contains an example of circuit delays for the various path segments shown in FIG. 1. In Table 2 the designation, for example, T1 refers to the time delay of path segment 1 from FIG. 1. From Table 2, it is apparent that T1 is 4 ns. The path delay through various combinational elements may vary depending upon the timing characteristics of the particular element. Since this is not significant to illustrating the embodiments described herein, in Table 2 an assumption is made that the time delay for each of the combinational elements (the various LUTs and gates) is 1 ns.

TABLE 2

| PATH SEGMENT | INTERCONNECT/COMBINATIONAL* CIRCUIT COMPONENT DELAY |
|---|---|
| 1 | $T_1 = 4$ ns |
| 2 | $T_2 = 1$ ns |
| 3 | $T_3 = 2$ ns |
| 4 | $T_4 = 1$ ns |
| 5 | $T_5 = 2$ ns |
| 6 | $T_6 = 7$ ns |
| 7 | $T_7 = 1$ ns |
| 8 | $T_8 = 1$ ns |
| 9 | $T_9 = 2$ ns |
| 10 | $T_{10} = 1$ ns |
| 11 | $T_{11} = 2$ ns |
| 12 | $T_{12} = 2$ ns |
| 13 | $T_{13} = 1$ ns |
| 14 | $T_{14} = 2$ ns |
| 15 | $T_{15} = 1$ ns |
| 16 | $T_{16} = 5$ ns |
| 17 | $T_{17} = 4$ ns |
| 17a | $T_{17a} = 2$ ns |
| 18 | $T_{18} = 1$ ns |
| 19 | $T_{19} = 4$ ns |
| 20 | $T_{20} = 3$ ns |
| 21 | $T_{21} = 1$ ns |
| 22 | $T_{22} = 2$ ns |

*For illustration purposes, although delay may vary, assume each combinational element (LUT and GATE) has a 1 ns delay.

By summing the path delay of the various path segments, the path delay for a particular circuit path can be determined.

TABLE 3

| PATH NUMBER | PATH DELAY (Σ OF PATH SEGMENT DELAY) | PATH SLACK (REQUIRE TIME-PATH DELAY) |
|---|---|---|
| 1 | 10 ns | −2 ns |
| 2 | 9 ns | −1 ns |
| 3 | 7 ns | +1 ns |
| 4 | 13 ns | −5 ns |
| 5 | 12 ns | −4 ns |
| 6 | 10 ns | −2 ns |
| 7 | 7 ns | +1 ns |
| 8 | 6 ns | +2 ns |
| 9 | 4 ns | +4 ns |
| 10 | 11 ns | −3 ns |
| 11 | 9 ns | −1 ns |
| 12 | 6 ns | +2 ns |
| 13 | 2 ns | +6 ns |

For purposes of illustration, and although this can be varied, for a given clock frequency the require time is assumed to be 8 ns.

Table 3 above shows the path delay for the various paths. In connection with path 13, the path delay is assumed to be 2 ns in this example (e.g., there may be a pair of interconnects and an intervening gate in this path which results in a 2 ns total delay). The path delay thus is an accumulation of the path segment delays arising from the combination of interconnects and combinational elements along this path.

For circuit path 1, in this example, the path delay is $T_1+T_2+T_3+T_4+T_5$. This path delay is 4 ns ($T_1$) plus 1 ns ($T_2$) plus 2 ns ($T_3$) plus 1 ns ($T_4$) plus 2 ns ($T_5$) for a total of 10 ns.

As one manner of determining whether a particular circuit path meets the timing criteria for a circuit, a require time (maximum allowable time) may be established for a signal to traverse a particular circuit path. In the example of Table 3, the require time is assumed to be 8 ns for all circuit paths. Given the require time, a path slack may be computed for the different circuit paths. The path slack is equal to the require time less the path delay. Thus, for example, for path 1 the path slack is 8 ns (require time) minus 10 ns (path delay), which equals −2 ns.

Table 3 above sets forth the path slack for the various circuit paths depicted in FIG. 1 in this example. With this approach, a negative path slack indicates that the circuit path does not meet the timing criteria. In contrast, a zero path slack or positive path slack corresponds to the circuit path meeting or exceeding (performing better than) the required timing criteria. During electronic circuit design, a threshold may be established for the path slack. For example, the threshold may be set at zero path slack. In this case, circuit paths with zero slack or positive slack numbers meet the timing criteria for operation of the circuit design at a clock speed for which the circuit is being designed. To provide additional leeway, the criteria may be set at a positive slack number such as 1. In this case, path slack numbers which are 1 or greater meet the timing criteria. In contrast, path slack times which are less than 1 (e.g., zero or negative) fail to meet the timing criteria.

In addition to path slack, pin slack may also be determined. Pin slack refers to the worst path slack of all circuit paths that go through (or are connected to) the given pin. Table 4 below sets forth pin slacks for the various pins in this example. This pin slack, for example, at LUT1 is −5 ns because the worst path slack going to LUT1 is path 4 which has a path slack of −5 ns.

TABLE 4

| PIN | PIN SLACK |
| --- | --- |
| $R_1Q_1$ | −2 ns |
| $R_2Q_2$ | −5 ns |
| $R_2D_2$ | +2 ns |
| $R_3Q_3$ | −2 ns |
| $R_4D_4$ | −5 ns |
| $R_5Q_5$ | −1 ns |
| $R_5D_5$ | −3 ns |
| $R_6D_6$ | −1 ns |
| $R_7D_7$ | −4 ns |
| $R_8D_8$ | −2 ns |
| I/O | +2 ns |
| LUT1 | −5 ns |
| LUT2 | −3 ns |
| LUT3 | −1 ns |
| LUT4 | +2 ns |
| G1 | −5 ns |
| G2 | −4 ns |
| G3 | −3 ns |

Pin slack is the worst path slack of all circuit paths that go through (are connected to) the given pin.

Table 4 assumes $R_1D_1$; $R_3D_3$; $R_4Q_4$; $R_7Q_7$; and $R_8Q_8$; are pins with positive pin slack.

Approaches for determining path slack and pin slack are known. In Table 4, an assumption is made that the slack at pins $R_1D_1$, $R_3D_3$, $R_4Q_4$, $R_7Q_7$ and $R_8Q_8$ meet the timing criteria (e.g., the threshold pin slack is zero and the pin slack at these pins is zero or positive).

In accordance with embodiments disclosed herein, circuit paths are clustered with placement and routing being performed on the cluster to improve the timing characteristics of the circuit design.

Initially, at least one first circuit path is selected for including in the cluster. Desirably, the initially selected circuit path is one which fails to meet the timing criteria and may be the worst case (worst slack) path. For example, path 1 may be selected because its path slack is negative in this example (−2 ns). Alternatively, path 1 may be selected because it includes LUT1 with a −5 ns pin slack which is the worst pin slack in this section of the electronic circuit design. As a way of selecting the initial circuit path for inclusion in the cluster, one can simply choose a combinational element with a negative pin slack and select a circuit path which passes through this combinational element as the initial circuit path. Indirect selection of the initial circuit path may also be accomplished by looking at one or more circuit paths which pass through the selected combinational element. Assuming a circuit path is initially selected for inclusion in the cluster which includes LUT1, one can determine other circuit paths for inclusion in the cluster by looking at those paths which are connected to LUT1 and which do not pass through a sequential element or primary port.

For example, from LUT1 one may trace in a first direction, such as forwardly, to pick up $G_1$ and $R_4$ (assuming an example where the terminal sequential element $R_4$ is included in the circuit path). The path trace goes from LUT1, interconnect 3, $G_1$, interconnect 5 and to $R_4$. One can also trace backward along interconnect 1 to $R_1$ and include $R_1$ in the path. The order and direction of tracing may be varied. In this manner, path 1 may be included in the cluster as an initially selected path. In addition, one can trace forward from LUT1 along interconnect 7, $G_2$, along interconnect 9, and to $R_7$ to thus include path 2 in the cluster. Similarly, one can trace forward along interconnect 11 to $R_8$ to add circuit path 3 to the cluster. Tracing backwards from LUT1, via interconnect 6, one can include $R_2$ in the cluster. Since $R_2$ is also driving another instance (LUT2), from $R_2$ one may trace forward to pick up LUT2, $G_3$ and $R_5$ for inclusion in the cluster. That is, path 10 may be included in the cluster. Furthermore, one may trace backward along interconnect 10 to include $R_3$ in the cluster.

Thus, a group of circuit paths is determined which are connected to LUT1 and which do not cross a sequential element or primary port. This entire group of circuit paths may be included in the cluster with the cluster then desirably being subjected to placing and routing and further timing analysis.

Alternatively, and more desirably, some circuit paths may be excluded from the originally identified group to form a smaller more focused cluster. For example, paths 7, 8 and 9 may be excluded from the cluster, which results in the exclusion of $R_3$ and interconnect 10; the remaining instances along these circuit paths 7, 8 and 9 are included in the cluster via other circuit paths (e.g., from paths 1, 2 and 3). This approach of excluding certain proximate circuit paths from the cluster can save processing time. Since timing problems have not been created by the $R_3$ and interconnect 10 portion of the circuit design, timing problems are unlikely to surface in this circuit segment as the result of performing placement and routing on instances from other circuit paths included in the cluster. Similarly, if circuit path 10 had met the timing criteria (e.g., zero or positive slack) it could also be excluded from the cluster although the instances from other circuit paths (e.g., from paths 4, 5 and 6) would remain included in this example because these circuit paths exhibit slack which does not meet the slack threshold.

In this manner, all circuit paths which are proximate to LUT1 and thus to a circuit path (e.g., path 1) which passes through LUT1 and which do not meet the timing criteria are desirably included in the cluster. A circuit path is proximate to LUT1 (and thus path 1) if it can be traced to LUT1 directly or indirectly (e.g., through an interconnect) without crossing a primary port or a sequential element.

In this manner, an initially selected circuit path and one or more proximate circuit paths are clustered together for timing analysis.

In one embodiment, the process is designed not to trace circuit paths across sequential instances and thus the tracing in this embodiment would not go beyond register $R_5$ (or for that matter beyond registers $R_1$, $R_2$, $R_3$, $R_4$, $R_7$ and $R_8$). In certain embodiments, crossing a sequential element may be allowed to permit the inclusion of one or more additional separated circuit paths in the cluster. A separated circuit path is one which is separated from other circuit paths included in a cluster by a sequential element. The method may allow automatic or selective inclusion of one or more levels of separated circuit paths (e.g., crossing only one sequential element) or circuit paths which are reached by crossing over more than one sequential element (e.g., a separated path which is separated from another separated path). As another embodiment, a user may determine whether to actuate an option which permits the inclusion of one or more separated circuit paths in a cluster which is to be analyzed. Desirably, although not a requirement, a separated circuit path is not included if it meets the timing criteria for the circuit.

Continuing this example, assume that the option of including additional separated circuit paths in a cluster is included automatically in the system or is opted for by a user. With reference to FIG. 1, for example, one would then examine circuit path 11 which is separated from circuit path 10 by sequential element $R_5$. In the example of FIG. 1, with the path slacks of Table 3, desirably one would not include circuit path 11 or its proximate circuit path 13 in the cluster because these paths exhibit characteristics which meet the timing requirements, e.g., they have a positive or non-zero slack. Similar checking can be performed to determine whether to include other separated paths in the cluster (e.g., path 12). Since path 12 in the example of Table 3 has a positive slack, path 12 would also desirably not be included in the cluster. This is true also if the pin slacks of Table 4 are used in evaluating whether to include a circuit path in the cluster, which is a more desirable approach. With the assumptions of Table 4 that the pin slacks at pins $R_1D_1$, $R_3D_3$, $R_4Q_4$, $R_7Q_7$ and $R_8Q_8$ meet the timing requirements, desirably no other separated paths would be included in this particular example. A user, could, as an option, designate particular paths for inclusion in a cluster regardless of whether the timing requirements for that path are met.

Assume for purposes of discussion, an example in which path 11 does not meet the timing requirements. In this case, if the embodiment automatically or selectively includes such separated paths, or a user-designated option for including separated paths is elected, then path 11 would be included in the cluster. In addition, other separated paths which are proximate to path 11 (e.g., path 13) in this example, are evaluated for possible inclusion in the cluster as additional separated paths. Desirably, such other additional separated paths would be included if they do not meet the timing criteria. Thus, for example, if path 13 also has a negative slack, it desirably in this example would be included in the cluster along with path 11 to thereby include a plurality of separated circuit paths in the cluster.

In summary, in one specific clustering embodiment which does not include separated circuit paths, and which excludes instances in circuit paths which meet the circuit design timing requirements, and with the path delays and timing characteristics of Tables 1, 2, 3 and 4, a cluster from FIG. 1 would include instances $R_1$, $R_2$, LUT1, LUT2, $G_1$, $G_2$, $G_3$, $R_4$, $R_5$, $R_7$ and $R_8$. This assumes an embodiment where the sequential elements at the start or origin of a circuit path and at the end or termination of a circuit path are included in the cluster.

Place and routing may be performed on the circuit paths and instances included in the cluster. In general, a significant portion of the delay in a circuit design arises from time delays along interconnects. By positioning instances in the clustered circuit paths closer together to thereby reduce interconnect lengths, circuit path delay times can be reduced. Thus, placing and routing may be performed on the selected cluster (as well as on other clusters selected for other portions of the circuit design) to thereby modify the circuit design with the goal of producing a circuit design which meets timing requirements. Although applicable before detailed placement and routing during the logical synthesis of electronic circuit design automation, the clustering techniques have particular applicability to the physical placement portion of electronic circuit design automation processes. Any placement and routing technique designed to improve the timing characteristics of a selected cluster of circuit paths may be used.

In one exemplary approach, topological-level based placement is used. This topological-level approach captures the design flow structure of a given cone of clustered circuit paths and instances. Timing optimization is achieved in this exemplary approach by honoring the topological-level of the instances.

Figure 2:
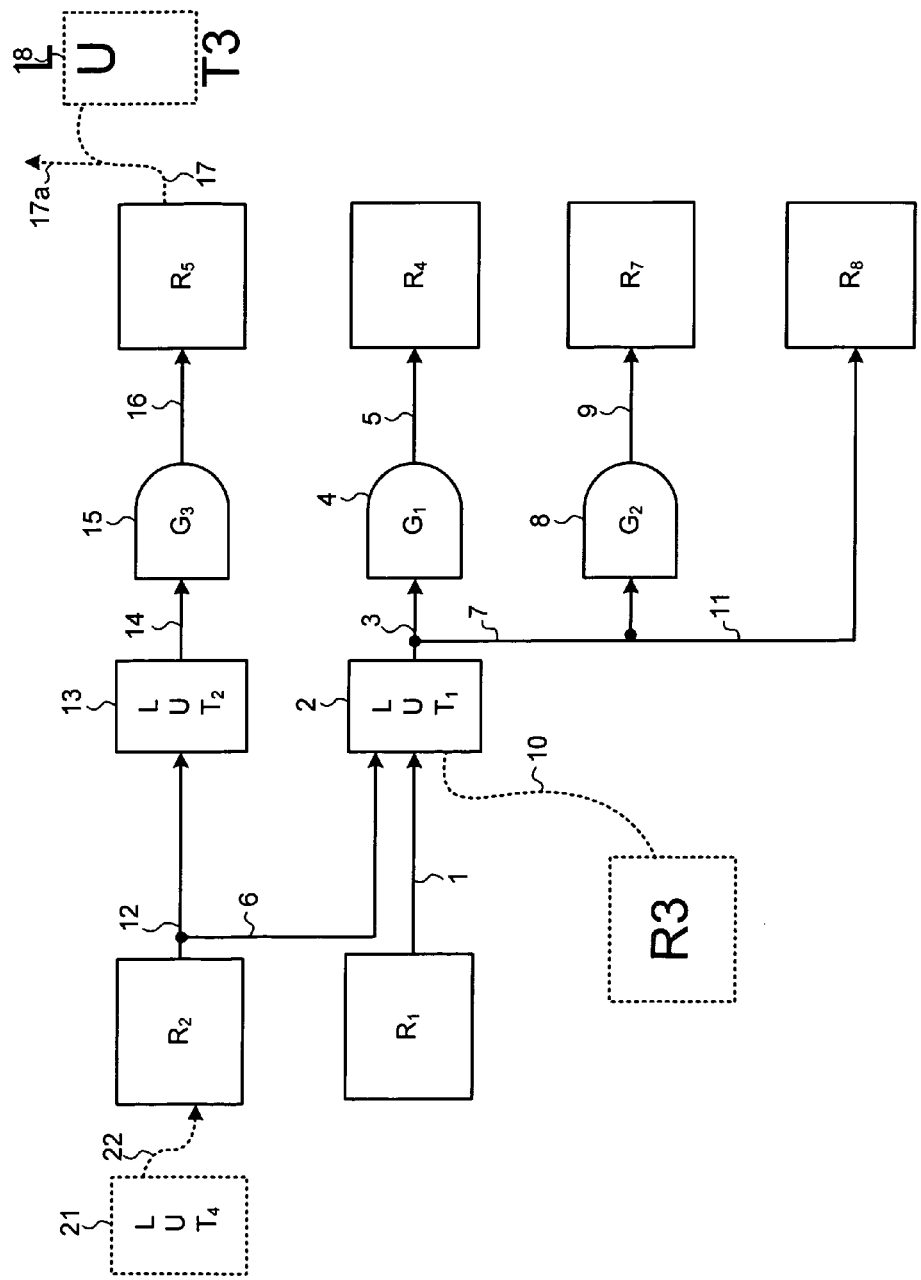
FIG. 2 schematically illustrates a portion of the circuit of FIG. 1 with clustered circuit paths.

FIG. 2 illustrates the six registers $R_1$, $R_2$, $R_4$, $R_5$, $R_7$ and $R_8$ included in the cluster of circuit paths as a result of the specific clustering example described above. Five combinational logic elements are also included in this exemplary cluster, namely, LUT1, LUT2, $G_1$, $G_2$, and $G_3$. These instances are included in the cone comprising the clustered circuit paths in this example. In this example, $R_3$, LUT3, LUT4 and interconnects 10, 17, 17a and 22 are shown in dashed lines in FIG. 2 because they have been excluded from the cluster and thus these instances are outside of the selected cone.

Figure 3:
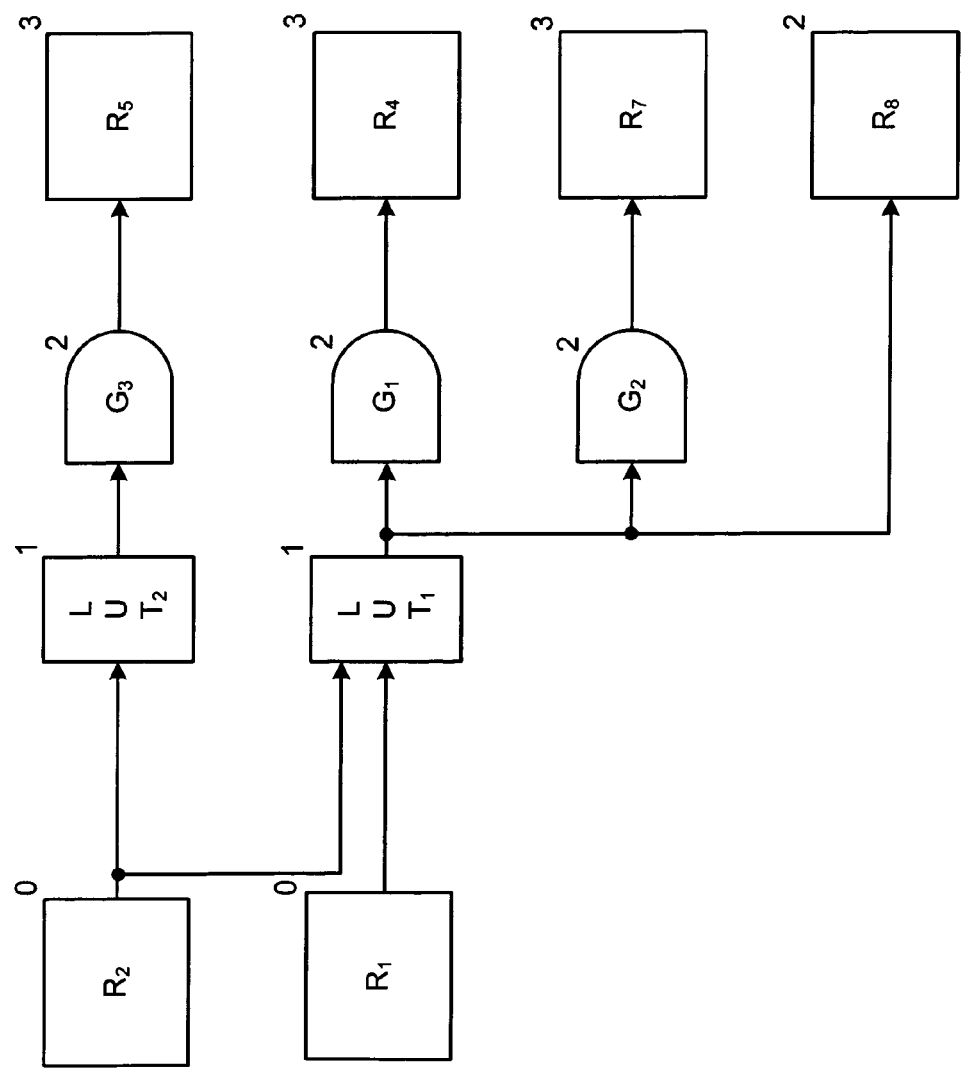
FIG. 3 illustrates clustered circuit paths of FIG. 2 with the logic labelled with topological levels for use in topological-level based placement of instances in the clustered circuit paths, it being understood that other place and route approaches may be used to adjust the positioning of instances included in the clustered circuit paths.

In FIG. 3, these excluded instances have been eliminated. In addition, each logic element in the cone has been labelled with its topological-level. Thus, $R_1$ and $R_2$ are level 0; LUT1 and LUT2 are level 1; $G_1$, $G_2$, $G_3$ and $R_8$ are level 2; and $R_4$, $R_5$ and $R_7$ are level 3. Once the topological-levels have been assigned, the placer may start the adjustment of the positioning of instances beginning with the lowest topological-level and moving in order toward the highest topological-level. Thus, for example, the placer may follow the order $R_2$, $R_1$; LUT2, LUT1; $G_3$, $G_1$; $G_2$, $R_8$; $R_5$, $R_4$ and $R_7$ to place them.

Figure 4:
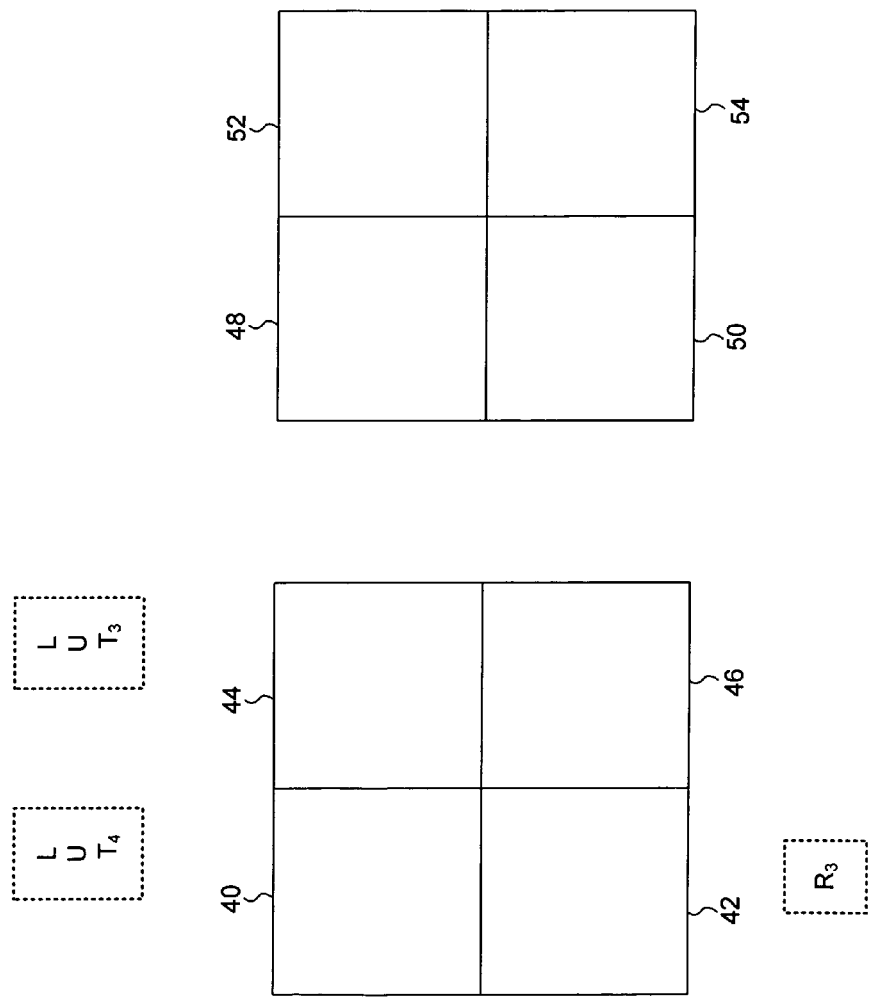
FIG. 4 schematically illustrates available locations for replaced or positionally adjusted circuit components from the cluster.

FIG. 4 illustrates the location of instances LUT3, LUT4, and $R_3$ which have been excluded from the cone in this example. FIG. 3 shows an area of eight units or slices 40, 42, 44 and 46 and 48, 50, 52 and 54 which are available for placement of instances from the cluster. For simplicity, and although not required, one can assume that each slice or unit area can hold only one combinational logic element and one sequential element (e.g., one register together with one LUT or one gate in this example).

Figure 5:
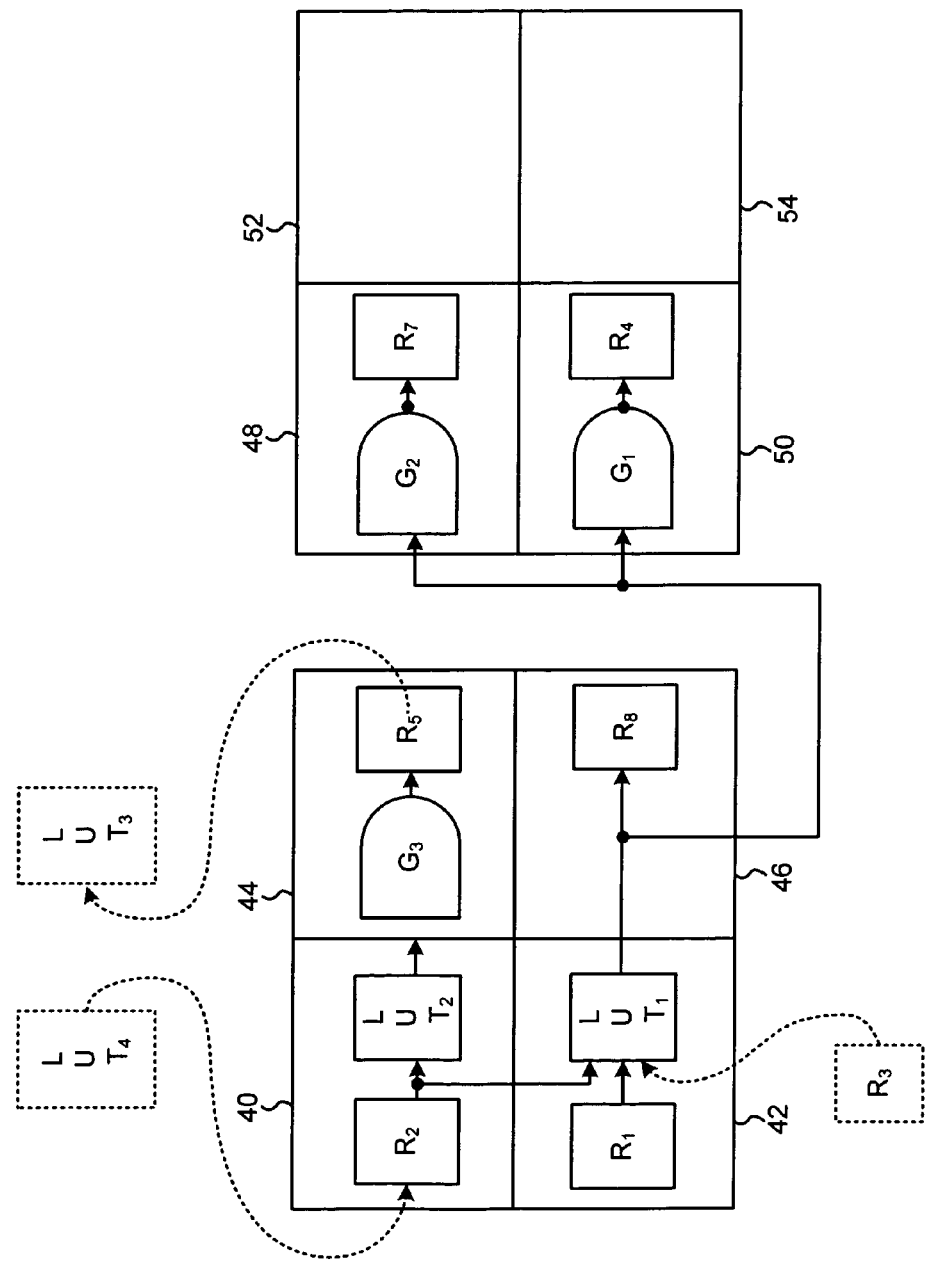
FIG. 5 illustrates the replaced or position adjusted locations of circuit components in the clustered circuit paths.

FIG. 5 illustrates the placement of the clustered instances in topological order. $R_2$ and $R_1$ are positioned in respective slices 40,42 with LUT1 and LUT2 also being positioned in these respective slices 40,42. The other instances are likewise placed while maintaining their topological-level. As a result, the length of interconnects between these instances is reduced. Again, the approach is not limited to a particular method for placing the instances of the clustered circuit paths.

Figure 6:
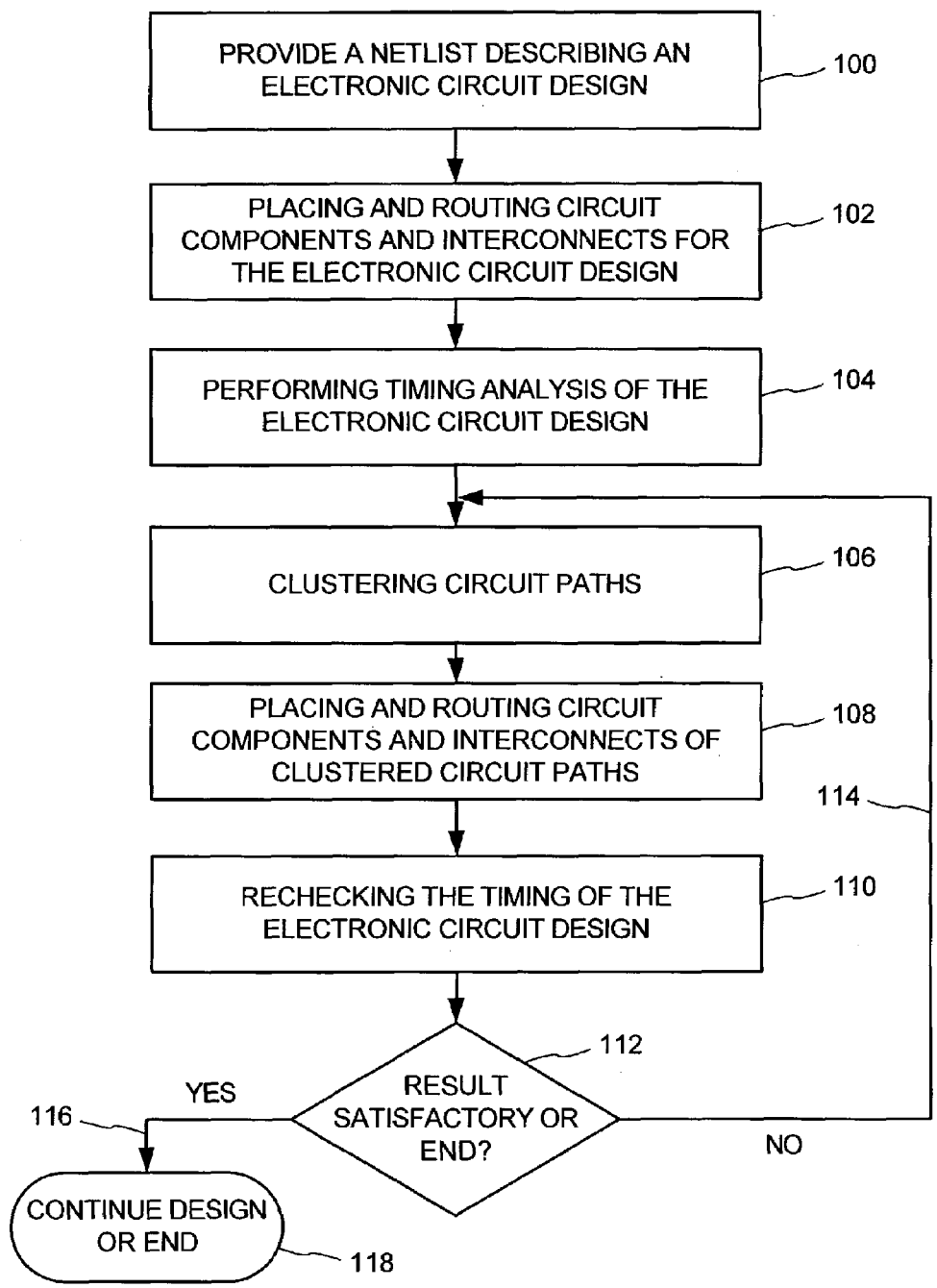
FIG. 6 is a flow chart of an exemplary circuit clustering path approach.

FIG. 6 is a flow chart of an exemplary electronic design automation process incorporating clustering techniques of the embodiments described herein. In FIG. 6, a net list describing an electronic circuit design generated as a result in electronic design automation process is provided at block 100. Placing and routing the circuit components and interconnects for the electronic circuit design is accomplished at block 102. At block 104, timing analysis of the electronic circuit design is performed. Desirably, in one specific example, this timing analysis comprises static timing analysis to generate pin slack and path slack numbers for the circuit design. The timing criteria (e.g., require time) and slack thresholds may be established or adjusted as part of the timing analysis.

Circuit paths are clustered at block 106, such as in the manner of one or more of the embodiments described herein. Placing and routing of circuit components (instances) and interconnects included in the clustered circuit paths is performed at block 108 with the desirable goal of improving the timing characteristics of the clustered circuit paths. At block 110 timing analysis is again performed. In a desirable example, path slack and pin slack numbers are generated for at least the clustered circuit paths which have been subjected to the placing and routing operation and more desirably for all of the circuit paths included in the electronic circuit design. At block 112 an evaluation is made as to whether timing problems still exist in the circuit (e.g., whether the circuit now performs satisfactorily at a given circuit speed) or whether the design process should end. For example, the process may end if, following a number of iterations, a closure, e.g., satisfactory timing performance, of the circuit design has not been achieved for the desired circuit speed. If the answer at block 112 is no, branch 114 is followed to block 106 and the clustering of circuit paths is repeated. Typically, this will involve clustering different circuit paths together than were clustered during a previous iteration due to the expected improvement of timing characteristics of at least some of the circuit paths included in the previous cluster. This iterative process desirably continues until satisfactory design results are reached or a determination is made to end the process, such as either by a user or by the system or program. Multiple circuit path clusters may be processed simultaneously with one another or sequentially. From the yes branch of block 112, path 116 is followed to flow chart location 118 where a determination is made to continue or end the electronic design automation process for the particular circuit design.

Figure 7:
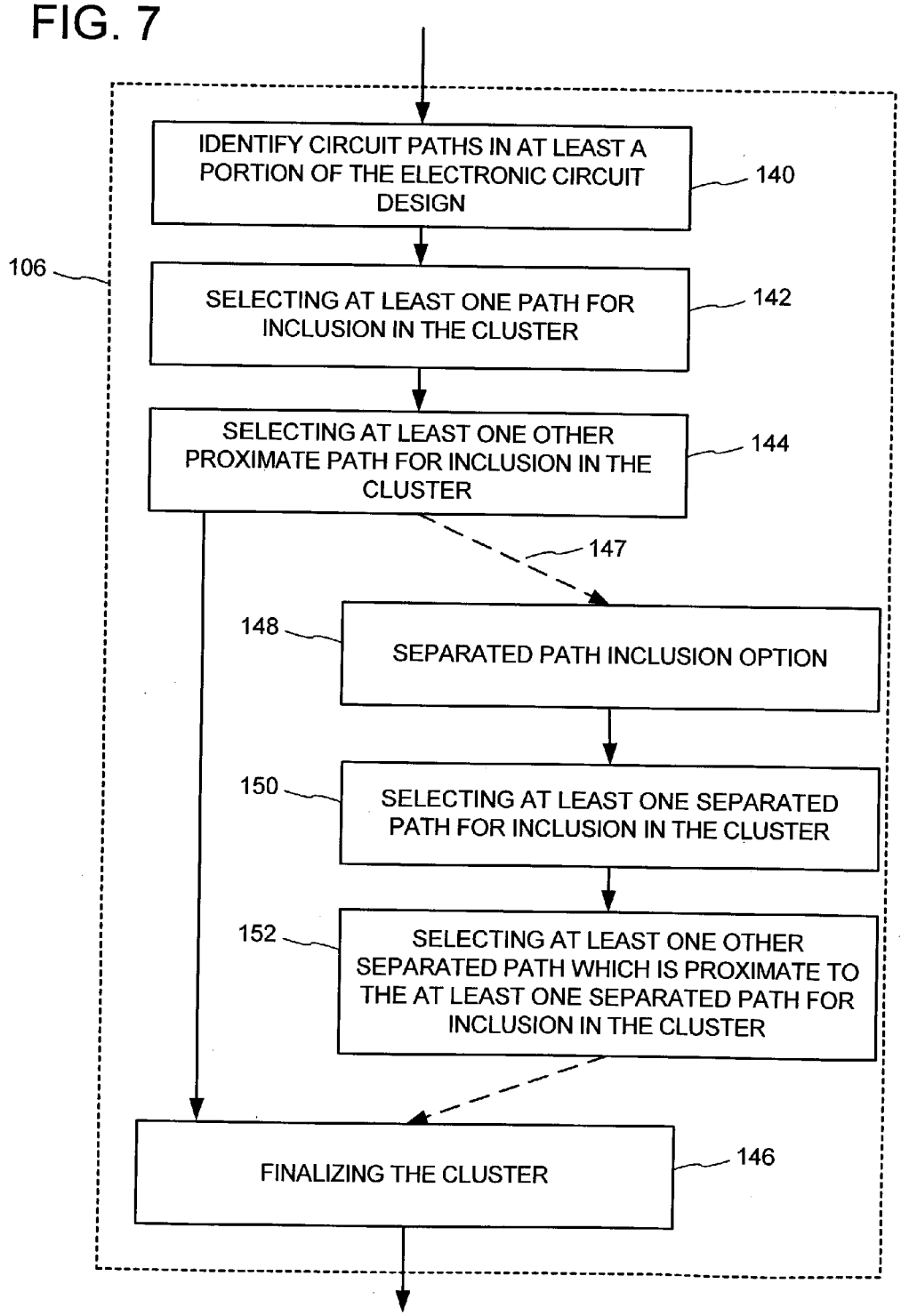
FIG. 7 is a flow chart of exemplary embodiments of circuit clustering.

FIG. 7 illustrates a flow chart of several embodiments for performing the clustering techniques at block 106 of FIG. 6. In FIG. 7, at block 140, at least a portion of an electronic circuit design is selected and circuit paths within that portion of the circuit design are identified. At block 142 at least one path is selected for inclusion in a cluster. As explained above, the selected path may be the worst case slack path in the identified portion of the circuit or some other path which fails to meet the circuit design timing requirements. This path may be selected by tracing from a combinational element included in the selected portion of the electronic circuit design. At block 144, at least one other proximate circuit path is selected for inclusion in the cluster. That is, another circuit path is selected which is connected to or which can be traced to the selected at least one circuit path without crossing a primary port or a sequential element. At block 146, the cluster is finalized. For example, certain paths may be excluded from the cluster which, although proximate to the at least one circuit path, meet the timing criteria for the electronic circuit design. Alternatively, all circuit paths may be included in the cluster which are proximate to the at least one path. As another alternative, all circuit paths may be included in the cluster which are both proximate to the at least one circuit path and which also fail to meet the circuit timing requirements.

FIG. 7 also illustrates a separated path inclusion option which may be automatically reached or reached as a result of a user designated option. If included, a path 147 is followed to a block 148 corresponding to the separated path inclusion option being active in the embodiment. From block 148, a block 150 is reached where at least one separated path is selected for inclusion in the cluster. As another option, even though block 150 is reached, the method may decline to select at least one separated path, for example, if there are no separated paths which fail to meet the timing requirements for the electronic circuit design. At block 152, at least one other separated path is selected which is proximate to the at least one separated path for inclusion in the cluster. In an alternative embodiment, such other separated circuit paths which are proximate to the initially selected separated circuit paths may only be selected if they exist and fail to meet the timing requirements of the circuit design. At block 146, the paths selected as a result of the process through blocks 142,144 and 148, 150 and 152 are included in the cluster. Additional circuit paths may be included in the cluster as a result of processing at block 146 and certain paths may be excluded (e.g., those that meet timing requirements for the circuit design).

Computer readable media such as electronic files, disks and other storage media may be programmed to carry out one or more of the above described embodiments. In addition, a computer comprising, for example, a central processing unit, memory, an input device such as a keyboard, mouse or other data entry mechanism, and a monitor may be programmed to carry out the clustering methods described herein. Computers programmed in this manner may be networked together and alternatively to one or more common servers.

Figure 8:
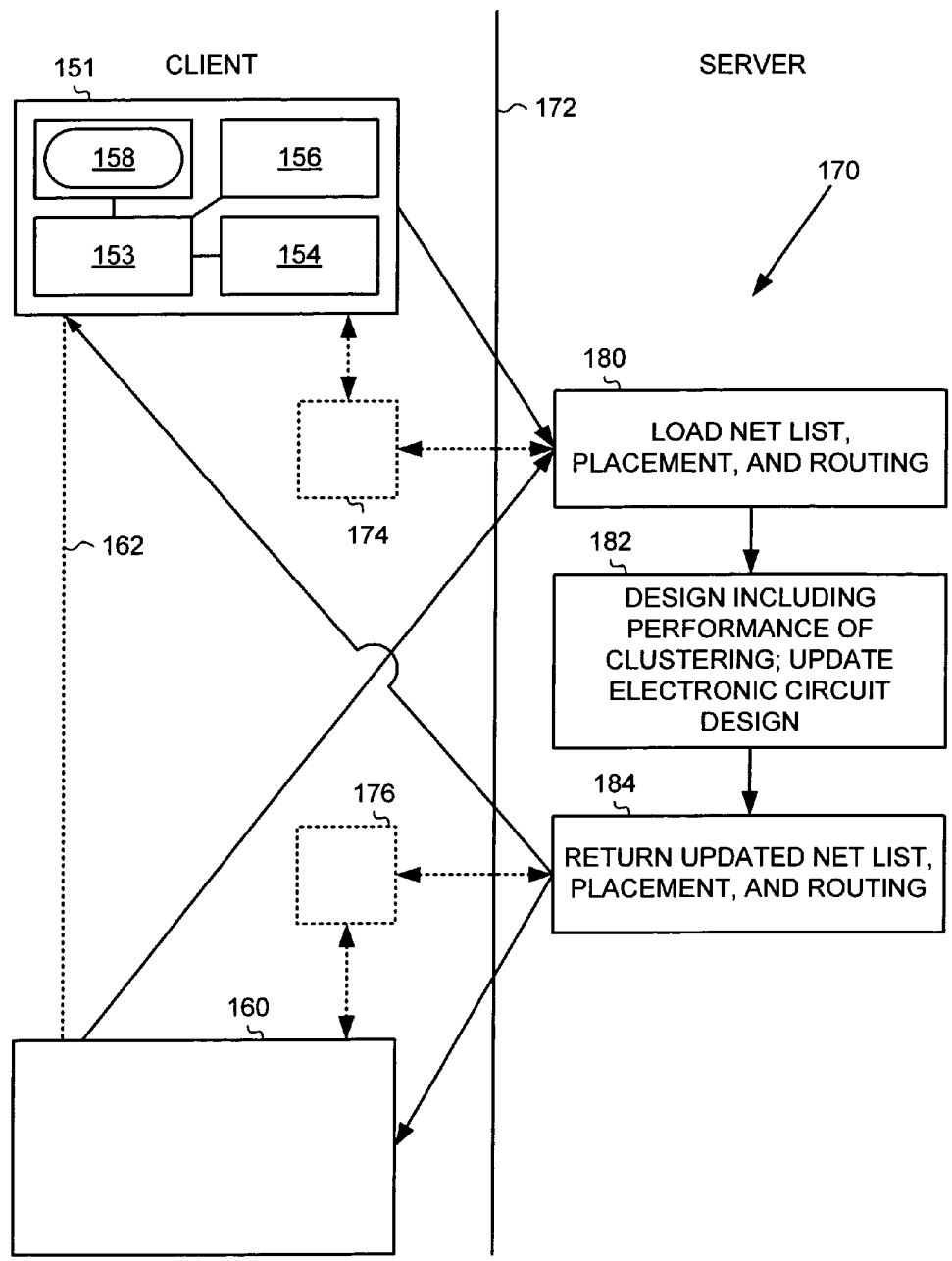
FIG. 8 is a schematic illustration of a client server environment in which the method may be implemented.

FIG. 8 illustrates an exemplary system in the form of a distributed computer network usable in carrying out the clustering techniques disclosed herein. In FIG. 8, a client computer 151 is shown. Computer 151 may also be a stand-alone computer. Computer 151 comprises a processor 153, associated memory 154, a data input device such as a keyboard 156, and a monitor 158. Computer 151 may be programmed to carry out the electronic design automation process including clustering of circuit paths for use in improving the overall circuit timing. One or more additional computers, such as computer 160, may be included in the system. Computer 160 may be coupled via a network 162 to computer 158. In addition, the computers 151, 160 may be coupled to a server computer 170. The server computer 170 may be remote from client computers 151, 160. In this example, the remoteness is depicted by a line 172. The computers 151, 160 and 170 desirably are interconnected over a network. As an alternative to a network connection, although less desirable, computer readable media 174,176 may be physically transferred between the various computers during the electronic design automation process. Although not shown, the server computer 170 may have an associated storage device (internal or external to the server computer). The server computer may also have associated data entry devices and displays. The tasks in an electronic circuit design automation process may be allocated between client and server computers. For example, the server computer 170 may be configured to perform various portions of the electronic design automation process including the clustering techniques previously described. As a specific example, computers 151,160 may provide a net list for an electronic circuit design to the server 170 which is then loaded at block 180. At block 182, electronic design automation steps are performed, such as clustering circuit paths, placing and routing instances in the clustered circuit paths, rechecking the timing of the clustered circuit paths, and repeating this process to thereby generate an updated net list describing the electronic circuit design. At block 184, the updated net list is returned to one or more of the client computers for use, for example, at the location of the client computers for completing the electronic circuit design.

Having illustrated and described the principles of our invention using exemplary embodiments, it will be apparent to those skilled in the art that these embodiments can be modified in arrangement and detail without departing from such principles. In view of the many possible embodiments, it will be recognized that the illustrated embodiments include only examples and should not be taken as limitations on the scope of the invention. Rather, the invention is directed to new and unobvious features and method acts disclosed herein, both individually and in subcombinations and combinations thereof, as defined by the following claims. The methods and apparatus are not limited to technology which overcomes all or any specific disadvantages of known technology or to any specific combination(s) of features or method acts. We therefore claim as our invention all such embodiments that come within the scope of these claims.

We claim:

1. A method of clustering a plurality of circuit paths of an electronic circuit design, the plurality of circuit paths comprising circuit components interconnected by circuit interconnections, the method comprising:

based on a comparison of slacks of at least some of the circuit paths to a slack threshold, including a first circuit path in the cluster which has a slack which does not meet the slack threshold;

including at least one additional circuit path in the cluster which has a slack which also does not meet the slack threshold and which is connected to the first circuit path without passing through any of a sequential element, a primary input port or a primary output port, wherein the first circuit path and the at least one additional circuit path comprise a cluster of circuit paths; and adjusting the placement of circuit components in the cluster of circuit paths to reduce the length of at least some of the circuit interconnections between the circuit components in the cluster of circuit paths.

2. A method of clustering a plurality of circuit paths according to claim 1 comprising the act of including in the cluster of circuit paths all circuit paths which do not meet the slack threshold and which are connected to the first circuit path without passing through any of a sequential element, a primary input port or a primary output port.

3. A method according to claim 2 comprising the act of adjusting the placement of circuit components included in the cluster of circuit paths to reduce the length of at least a plurality of the circuit interconnections between circuit components included in the cluster of circuit paths.

4. A method according to claim 2 wherein the slack threshold is zero slack.

5. A method according to claim 2 wherein the slack threshold is a positive slack number.

6. A method according to claim 2 comprising the act of excluding from the cluster of circuit paths all circuit paths which meet the slack threshold and which are connected to the first circuit path without passing through any of a sequential element, a primary input port, or a primary output port.

7. A method according to claim 6 further comprising the act of including in the cluster of circuit paths at least one separated circuit path which is not connected to the first circuit path without passing through at least one of a sequential element, a primary input port or a primary output port.

8. A method according to claim 7 wherein said at least one separated circuit path included in the cluster of circuit paths does not meet the slack threshold.

9. A method according to claim 8 wherein the cluster of circuit paths include a plurality of said separated circuit paths which do not meet the slack threshold.

10. A method according to claim 9 further comprising the act of including in the cluster of circuit paths all circuit paths which do not meet the slack threshold and which are connected to any of said plurality of said separated circuit paths without passing through any of a sequential element, a primary input port or a primary output port.

11. A computer-readable medium storing computer-executable instructions for causing a computer system to perform the method of claim 1.

12. A computer-readable medium storing computer-executable instructions for causing a computer system to perform the method of claim 2.

13. The method of claim 2 wherein clustering a plurality of circuit paths is performed by a combination of at least one client computer and at least one server.

14. The method of claim 13 wherein clustering of a plurality of circuit paths is performed by the at least one server.

15. The method of claim 13 further comprising transferring an electronic file corresponding to the electronic circuit design from the at least one client computer to the at least one server.

16. The method of claim 15 wherein a network is used to transfer the electronic file.

17. The method of claim 15 wherein a computer-readable medium is used to transfer the electronic file.

18. The method of claim 13 further comprising the act of adjusting the placement of plural circuit components included in the cluster of circuit paths to reduce the length of at least a plurality of the circuit interconnections between circuit components included in the cluster of circuit paths.

19. The method of claim 18 wherein the act of adjusting the placement of plural circuit components included in the cluster of circuit paths is performed by at least one server and further comprising the act of transferring an electronic file from said at least one server to at least one client computer, the transferred electronic file corresponding to the electronic circuit design subsequent to the adjusting of the placement of plural circuit components.

20. A method, according to claim 1, further comprising:
identifying the first circuit path which has a slack which does not meet the slack threshold,
the at least one additional circuit path having at least one path element in common with the first circuit path, and
each of the first and the at least one additional circuit paths starting at and including at its start a first sequential element or primary port and ending at and including at its ending a second sequential element or primary port, the first circuit path also passing from its start to its end without passing through any of a sequential element, a primary input port, or a primary output port.

21. A method according to claim 20 wherein the first and the at least one additional circuit paths each include in the circuit path a sequential element or primary port at one end thereof and a sequential element or primary port at the other end thereof.

22. The method of claim 21 wherein the at least one path element comprises an interconnect.

23. The method of claim 21 wherein the at least one path element comprises a combinational component.

24. The method of claim 21 wherein there are plural of said additional circuit paths and the method further comprising grouping the first circuit path with all additional circuit paths which do not meet the slack threshold and which also have at least one path element in common with the first circuit path.

25. The method of claim 20 wherein the slack threshold is based on both a path slack and a pin slack and wherein the slack threshold comprises the first circuit path having a negative path slack associated therewith and having at least one combinational element with a negative pin slack included therein.

26. The method of claim 25 wherein the negative pin slack associated with the first circuit path is also the worst pin slack among the circuit paths.

27. The method of claim 25 further comprising identifying and adding to the cluster all other circuit paths comprising the combinational element with the negative pin slack that also have a negative path slack associated therewith.

28. A tangible computer-readable medium having stored thereon computer-readable instructions for executing the method of claim 25.

29. The method of claim 20 wherein identifying the first circuit path that does not meet the slack threshold comprises identifying the first circuit path having included therein at least one combinational element with a negative pin slack.

30. The method of claim 29 wherein including the at least one additional circuit path comprises identifying and adding the at least one additional circuit path having a negative path slack.

31. A tangible computer-readable medium having stored thereon computer-readable instructions for executing the method of claim 30.

32. The method of claim 25 wherein the pin slack is determined based on determining a worst path slack among all the path slacks associated with circuit paths connected directly to the combinational element.

* * * * *